United States Patent
Roohparvar

[19]

[11] Patent Number: 6,014,332

[45] Date of Patent: *Jan. 11, 2000

[54] FLASH MEMORY WITH ADJUSTABLE WRITE OPERATION TIMING

[75] Inventor: Frankie Fariborz Roohparvar, Cupertino, Calif.

[73] Assignee: Micron Technology, Inc., Boise, Id.

[ * ] Notice: This patent is subject to a terminal disclaimer.

[21] Appl. No.: 09/292,509

[22] Filed: Apr. 15, 1999

Related U.S. Application Data

[63] Continuation of application No. 09/045,605, Mar. 20, 1998.

[51] Int. Cl.⁷ .................................................. G11C 16/04
[52] U.S. Cl. .............................. 365/185.33; 365/185.28; 365/226
[58] Field of Search .................... 365/185.19, 185.28, 365/185.33, 226, 185.22

[56] References Cited

U.S. PATENT DOCUMENTS

| | | | |
|---|---|---|---|
| 5,305,263 | 4/1994 | Morgan | 365/190 |
| 5,615,151 | 3/1997 | Furuno et al. | 365/185.18 |
| 5,619,453 | 4/1997 | Roohparvar et al. | 365/185.33 |
| 5,619,461 | 4/1997 | Roohparvar | 365/201 |
| 5,627,784 | 5/1997 | Roohparvar | 365/189.01 |
| 5,742,558 | 4/1998 | Hashimoto | 365/233.5 |
| 5,754,469 | 5/1998 | Hung et al. | 365/185.03 |
| 5,761,117 | 6/1998 | Uchino et al. | 365/185.03 |
| 5,768,287 | 6/1998 | Norman et al. | 371/21.2 |
| 5,787,039 | 7/1998 | Chen et al. | 365/185.22 |
| 5,790,453 | 8/1998 | Chevallier et al. | 365/185.03 |
| 5,796,657 | 8/1998 | Lee et al. | 365/185.33 |
| 5,825,693 | 10/1998 | Lee et al. | 365/230.06 |
| 5,898,634 | 4/1999 | Chevallier | 365/226 |

OTHER PUBLICATIONS

"Compact Flash 4–15 MB", *Flash Memory Data Book*, Micron Quantum Devices, Inc., 3–1:3–4, (1997).
"Flash Memory 2 Meg X 8", *Flash Memory Data Book*, Micron Quantum Devices, Inc., 2–5:2–33, (1997).

*Primary Examiner*—David Nelms
*Assistant Examiner*—Gene N. Auduong
*Attorney, Agent, or Firm*—Schwegman, Lundberg Woessner & Kluth P.A.

[57] ABSTRACT

A flash memory is described which includes circuitry to determine how many memory cells can be programmed in a single write operation by measuring the power available for programming. The available power is determined by monitoring Vcc and/or Vpp prior to performing a data write operation. The memory control circuit adjusts the memory write operation based upon the actual operating conditions and is not limited in performance to anticipated specification limits. A method is described which reduces the number of total write operations by performing a limited number rewrites in place of individual rewrite operations by rewriting only memory cells which where not properly programmed. Rewrite operations of properly programmed memory cells is avoided to reduce the total number of write operations.

36 Claims, 4 Drawing Sheets

FLASH MEMORY WITH ADJUSTABLE WRITE OPERATION TIMING

This application is a continuation of U.S. Ser. No. 09/045,605 Mar. 20, 1998.

TECHNICAL FIELD OF THE INVENTION

The present invention relates generally to memory devices and in particular the present invention relates to write operations in flash memory devices.

BACKGROUND OF THE INVENTION

In a flash memory it is desired to write data in the fastest manner possible. As such, multiple bytes of data are often written to the memory in one write operation. Because flash write operations are not always successful on a first memory cell program operation, data check and rewrite operations are often employed. Thus, a write operation is conducted on a group of memory cells and the state of the memory cells following the write operation is determined. If any of the memory cells have not been written to a correct logic state, a second write operation is performed on the same memory cells. Because of the necessity to rewrite memory cells, each write operation often requires multiple write cycles which adversely affect the performance speed of the flash memory.

A second factor which also adversely affects the performance speed of a flash memory is the availability of an adequate power supply during write operations. Flash memories include arrays of flash cells, or transistors, that are electrically programmed using relatively high drain and gate bias voltages. However, designers of electrical systems that incorporate flash memories prefer not to include high voltage supplies in the electrical systems in order to reduce electrical system cost and power consumption. As a result, flash memories are designed for use with low voltage supplies having voltages, for example, as low as three volts.

Flash write operations required a relatively substantial current. For example, it is common to use 500 microamps per memory cell during a right operation. A two-byte write operation, therefore, requires 8 milliamps of current at a six-volt power supply. This power is not a major concern where an external Vpp supply is available. However, in low voltage memory devices the availability of this external supply is often eliminated. Thus, the flash memories are also designed to include charge pumps to create the required higher Vpp supply voltages. In addition, internal Vpp supply generators or charge pumps are limited, primarily due to economic reasons, in the amount of current which can be provided during write operations.

Conventional charge pumps can simultaneously program only relatively few flash cells. The number of memory cells, therefore, written during one write cycle is reduced into segments. One typical 16-bit programming operation is performed 4 bits, rather than 16 bits, at a time. This segmented programming operation significantly increases the programming time of flash memories. For example, a flash memory which is specified to operate a three volt power supply may be limited to writing 4 bits of data at once. To write two bytes of data, four separate write operations are required. Similarly, a flash memory which is specified to operate at six volts may be limited to writing one byte of data at once. To further complicate operating speed during write operations, as explained above, rewrite operations are often necessary.

Therefore, there is a need to reduce the programming time of flash memories. For the reasons stated above, and for other reasons stated below which will become apparent to those skilled in the art upon reading and understanding the present specification, there is a need in the art for a flash memory device which can operate using a low voltage supply and an internal Vpp voltage generator during write operations, while minimizing time requirements for writing data to memory cells.

SUMMARY OF THE INVENTION

The above mentioned problems with flash memories and other problems addressed by the present invention will be understood by reading and studying the following specification. A memory is described which reduces data write time by monitoring available memory cell write power.

In particular, the present invention describes a flash memory device comprising an array of memory cells, power detection circuitry coupled to internal and external power supplies for determining available write operation programming power, and control circuitry for performing data write operations on the array of memory cells. The control circuitry is coupled to the power detection circuitry and is adapted to adjust a number of memory cells programmed in one write operation in response to the available write operation programming power.

In another embodiment, a flash memory device comprises an array of memory cells, power detection circuitry coupled to internal and external power supplies for determining available write operation programming power, and a charge pump for providing a programming voltage Vpp. The charge pump is coupled to the power detection circuitry and provides available write operation programming power. The flash memory device further comprises control circuitry for performing data write operations on the array of memory cells, the control circuitry is coupled to the power detection circuitry and adapted to adjust a number of memory cells in a group of memory cells programmed in one write operation in response to the available write operation programming power. The control circuitry controls the flash memory to write data to the memory cells in a plurality of memory cell groups, and a rewrite operation is performed after data is written to all of the plurality of memory cell groups to program only memory cells which were not properly written to a correct data state.

A method of writing data to X memory cells of a flash memory is described. The method comprises the steps of performing Y write operations, each of the Y write operations program X/Y memory cells, verifying data states of the programmed X memory cells, and performing a rewrite operation on memory cells which were not properly programmed during the Y write operations. The rewrite operation is performed after all Y write operations have been performed.

Another method of operating a flash memory device is described. The method comprises the steps of detecting an available write operation programming power, and adjusting the flash memory to write to a group of memory cells in one cycle. A length of the group is determined in response to the detected available write operation programming power.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The present invention provides a memory which adapts write operations to different voltage supply levels provided. A method of writing data is described below which reduces total write time by managing rewrite operations. Prior to describing these features in greater detail, a brief description of the flash memory of the present invention is provided.

FLASH MEMORY

Figure 1A:
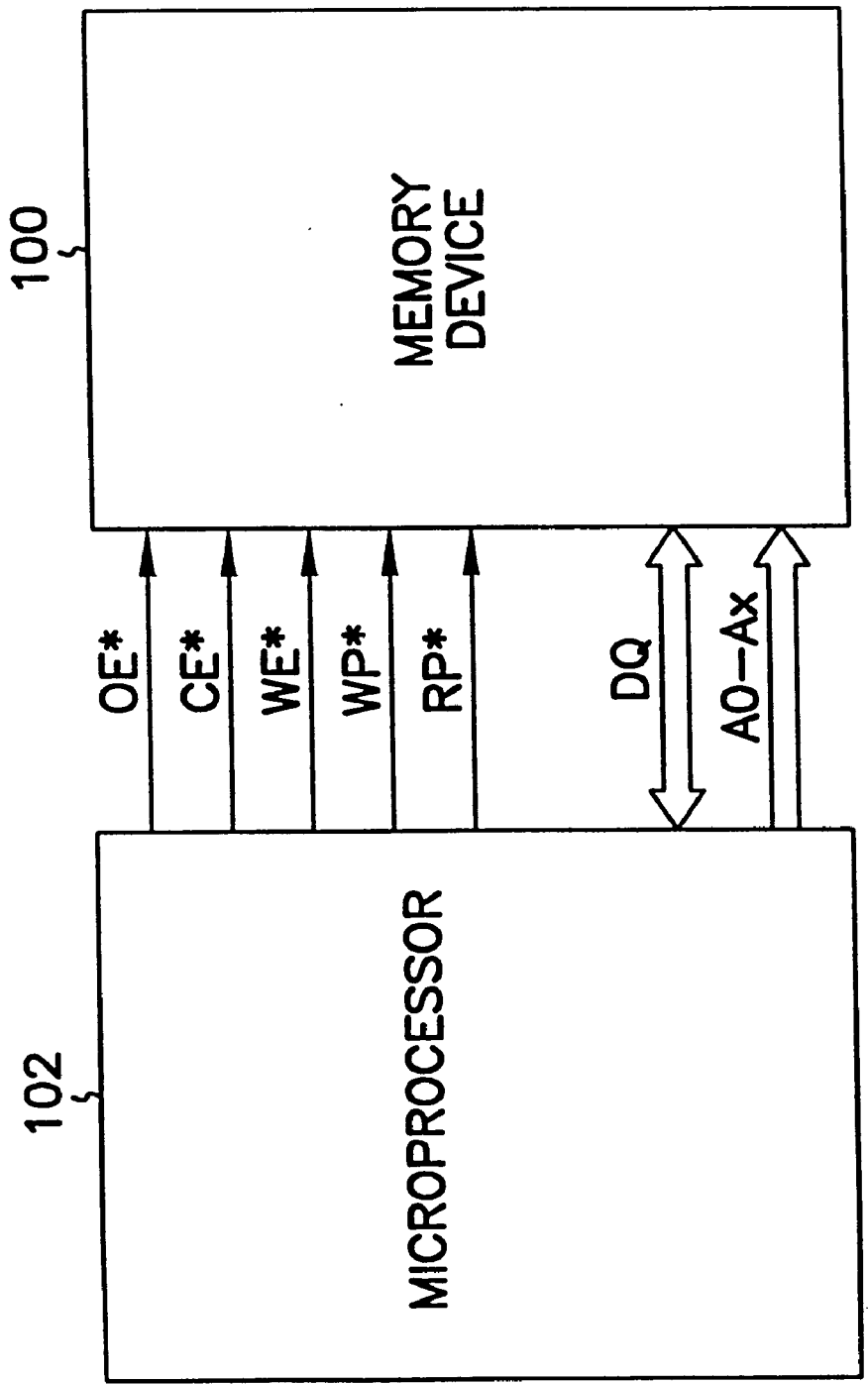
FIG. 1A is a block diagram of a flash memory incorporating the present invention.
Figure 1B:
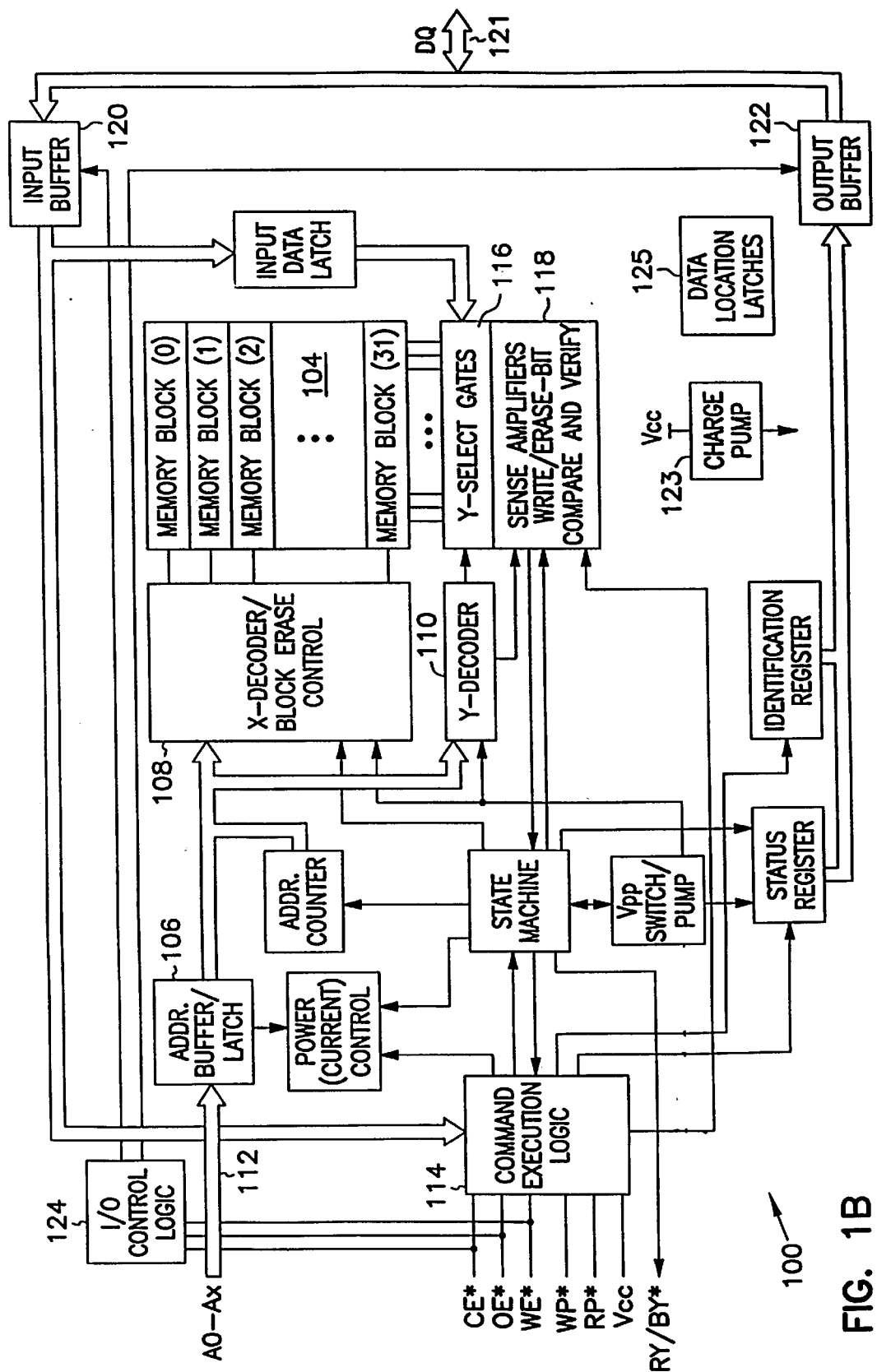
FIG. 1B is a more detailed illustration of the memory of FIG. 1A.

FIG. 1A illustrates a block diagram of a Flash memory device 100 which is coupled to a flash controller 102. The memory device has been simplified to focus on features of the memory which are helpful in understanding the present invention. The memory device 100 includes an array of memory cells 104, FIG. 1B. The memory cells are preferably floating gate memory cells. The array is arranged in rows and columns, with the rows arranged in blocks. The blocks allow memory cells to be erased in large groups. Data, however, is stored in the memory array in small data groups (byte or group of bytes) and separate from the block structure. Erase operations are performed on a large number of cells in parallel.

An x-decoder 108 and a y-decoder 110 are provided to decode address signals provided on address lines A0-Ax 112. Address signals are received and decoded to access the memory array 104. An address buffer circuit 106 is provided to latch the address signals. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The flash memory includes a charge pump circuit 123 which generates a Vpp voltage used during programming of the memory cells and other internal operations. During write operations, Vpp is coupled to the memory cells for providing appropriate write operation programming power. Charge pump designs are known to those skilled in the art, and provides power which is dependant upon an externally provided supply voltage Vcc.

Latch circuitry 125 is provided in the memory for latching locations of memory cells which are not successfully written to during a memory write operation. The latch circuitry allows rewrite operations, as described below, to be performed after a plurality of separate memory write operations are performed.

Figure 1C:
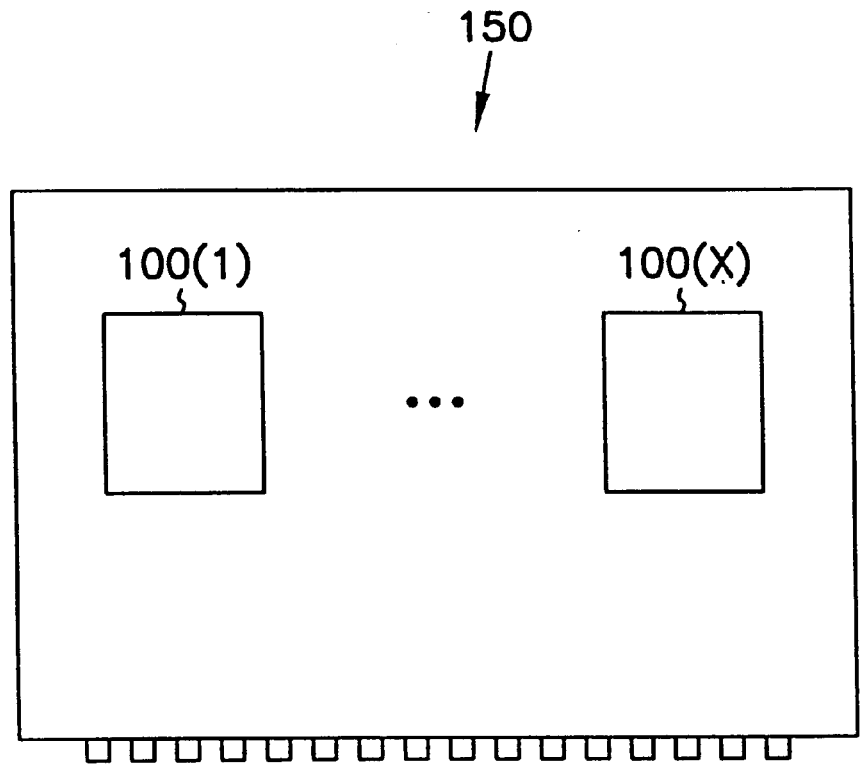
FIG. 1C illustrates a Flash memory card including the memory of FIG. 1A.

As stated above, the Flash memory of FIG. 1A has been simplified to facilitate a basic understanding of the features of the memory. A more detailed understanding of Flash memories is known to those skilled in the art. See "1997 Flash Memory Data Book" pages 2-5 to 2-33 available from Micron Quantum Devices, Inc. (incorporated herein by reference) for a more detailed description of a Flash memory. It will be appreciated that more than one Flash memory can be included in various package configurations. For example, Flash memory cards 150 can be manufactured in varying densities using numerous Flash memories 100(1)–100(x) as illustrated in FIG. 1C. See "1997 Flash Memory Data Book" pages 3-1 to 3-3 available from Micron Quantum Devices, Inc. (incorporated herein by reference) for a more detailed description of a Flash memory card.

Conventionally, a flash cell is programmed by charging the floating gates of flash cells. The charge is drawn from the flash cells' channels into the floating gates by applying relatively high drain-to-source and gate-to-source voltage pulses to the flash cells. For example, the drain-to-source and gate-to-source voltage pulses could have typical amplitudes of respectively five and eleven volts, and minimum amplitudes of zero volts. These gate-to-source and drain-to-source voltage pulses respectively have pulse widths of twelve microseconds and ten microseconds.

When the amplitude of the drain-to-source voltage pulse is minimum, the flash cell operates in its cut-off region. When the amplitude of the drain-to-source voltage pulse is maximum, the flash cell operates in its linear region because the threshold of an erased or unprogrammed flash cell is typically about three volts. During the transition of the drain-to-source voltage pulse between minimum and maximum amplitudes, the flash cell operates briefly in its saturated region.

In both the saturated and linear regions, modern flash cells generate hot electrons, in the channel current, that travel at a saturated or maximum velocity, and thus have high energy. Hot electrons arise in the channels of modern flash cells because the drain-to-source voltages are sufficiently high, and the flash cells' gate lengths are sufficiently small. Hot electrons in the channel current form the programming current used to program the flash cell. The programming current is the flow of hot electrons from a flash cell channel into its floating gate. Hot electrons can only surmount the energy barrier separating the floating gate and the channel when the energy barrier is reduced by a sufficiently high gate-to-source voltage, such as when the flash cell operates in the linear region.

WRITE OPERATIONS

As stated above, 16 bits of data can be written to a flash memory in one cycle if a sufficiently large supply is provided. Because flash memories are often required to operate at lower supply voltages, designers adjust the number of bits written per cycle to meet the memory specification. For example, if a low minimum Vcc is specified, such as three volts, the memory is designed to write four bits per cycle. If the memory is specified to have a minimum Vcc of five volts, then the memory is designed to write 8-bits per cycle. By designing the memory to operate at its minimum specification, delays in writing to the memory can be experienced. That is, if a memory is specified to operate at a Vcc of three volts and designed to write four bits per cycle, but is actually operated with a Vcc of five volts the memory does not operate at an optimum speed.

Figure 2:
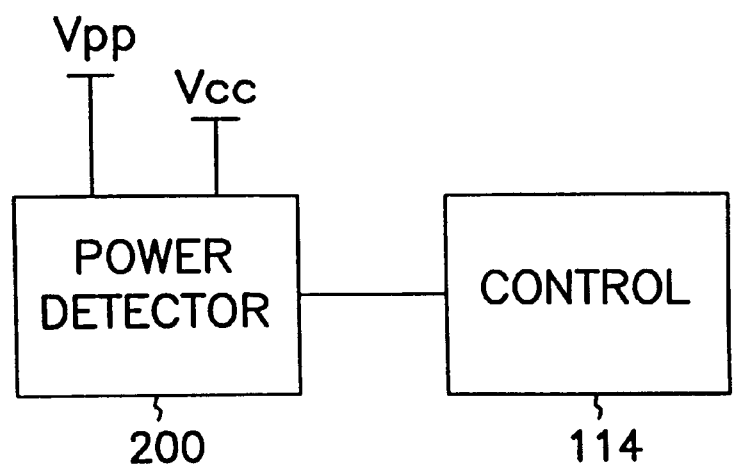
FIG. 2 a block diagram of a portion of the flash memory provided to monitor available programming power.
Figure 3:
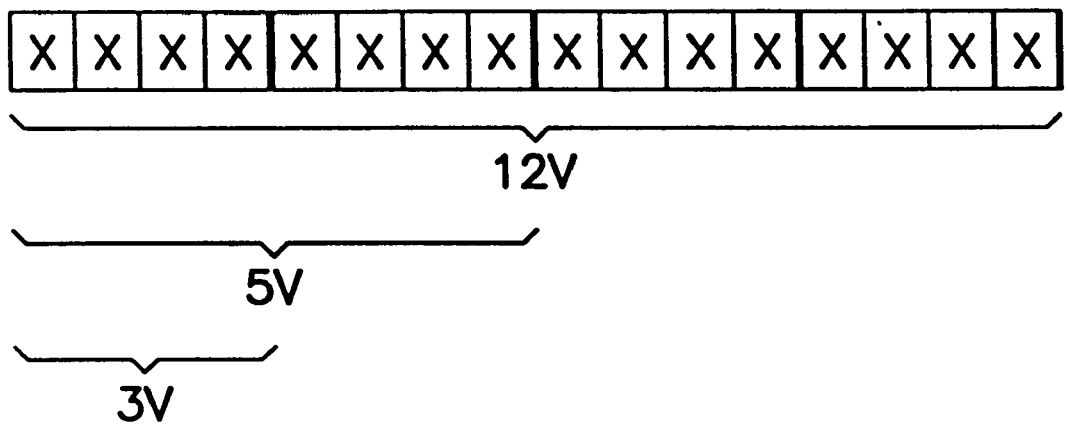
FIG. 3 is a diagram of a two byte section of the memory array of the flash memory of FIG. 1A.

Referring to FIG. 2, one embodiment of a memory of the present invention includes a power detector circuit 200 which monitors the Vcc and/or Vpp voltage levels and provides an output to control circuit 114. The control circuit adjusts the memory write operation according to the power detector output. As illustrated in FIG. 3, if the Vpp level is low, around three volts, four bits of data are written at one time. If a higher Vpp is detected, around five volts, the memory is controlled to write one byte at a time. Likewise, if a high Vpp is detected, around 12 volts, a two byte write is performed. It will be appreciated that the number of bits written can be varied, and is not limited to groups of four bits. Further, the level of Vpp which is used to change the number of bits written can vary and is controlled by the amount of power provided by the source of Vpp and the amount of current required to program the memory cells. Thus, a Vpp of four volts could be used to program more than four bits in one cycle. The power detector 200 can comprise a set of comparator circuits which have predetermined threshold values set at the voltages required to change the number of bits-per-write cycles.

Figure 4:
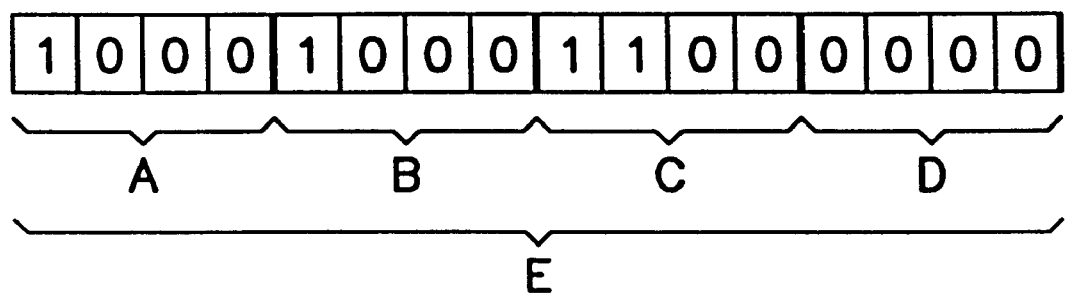
FIG. 4 a diagram of a programmed two byte section of the memory array of the flash memory of FIG. 1A.

To further reduce the time needed to write data to the memory device, a simplified method of writing data is performed. Prior to describing the inventive method, a brief detailed description of prior flash memory write operations is provided. The typical method, as described above, for writing data to a flash memory is to write data to a group of memory cells, check the data state of the group, and re-write the group if necessary. Referring to FIG. 4, two bytes of data are illustrated Each bit was to be written to a logic zero state. Thus, at least one bit in groups A, B, and C did not properly write. In a typical flash memory each group would be tested and rewritten prior to writing the next group. Thus, in a typical flash memory, designed to write four bits per write, would write bit group A, test group A, and then rewrite group A. Groups B and C would also require two write operations each. Group D would require only one write operation. The two bytes of FIG. 4, therefore, would require seven write operations, or cycles.

The present invention provides a methodology which reduces the total write time for memory cells which are written in subgroups. Referring again to FIG. 4, each group A, B, C and D are written and tested. The location of memory cells which were not correctly programmed are latched in the memory. Individual rewrite operations are not performed on the groups prior to writing the next group. After all of the groups of memory cells are written and verified, all of the memory cells which require a rewrite are written to in one step E. That is, the four bits in groups A, B and C are rewritten in one cycle. Locations of the memory cells which require a rewrite operation are latched in the latch circuitry. Thus, the two bytes of FIG. 4 are written to logic zero states in five write operations. Assuming that each group of four bits requires 10 $\mu$ seconds per write operation, the typical method requires 70 $\mu$ seconds (7 write operations) while the present invention uses 50 $\mu$ seconds (5 operations).

It will be appreciated by those skilled in the art that the data can be tested after each group is written to, or the entire two bytes can be tested at one time. Further, if the total number of memory cells which require a rewrite operation exceeds the number of memory cells which can be written in one write operation, the rewrite operation can be performed in multiple operations. That is, if there are six memory cells requiring a rewrite, the first four can be written in one step, while the remaining cells are written in a second step. A savings of 10 $\mu$ seconds is still experienced.

CONCLUSION

A flash memory has been described which includes circuitry to determine how many memory cells can be programmed in a single write operation by measuring the power available for programming. The available power is determined by monitoring Vcc and/or Vpp prior to performing a data write operation. The memory control circuit, therefore, can adjust the memory write operation based upon the actual operating conditions and is not limited in performance to anticipated specification limits. A method has been described which reduces the number of total write operations by performing group rewrites in place of individual rewrite operations. This is accomplished by rewriting only memory cells which where not properly programmed. Thus, rewrite operations of properly programmed memory cells is avoided to reduce the total number of write operations.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of writing data to memory cells of a flash memory, the method comprising:

performing write operations on a first set of memory cells;

verifying data states on the first set of memory cells to identify any memory cells of the first set of memory cells which did not properly store data during the write operations;

performing write operations on a second set of memory cells;

verifying the data states on the second set of memory cells to identify any memory cells of the second set of memory cells which did not properly store data during the write operations;

performing write operations on a third set of memory cells;

verifying the data states on the third set of memory cells to identify any memory cells of the third set of memory cells which did not properly store data during the write operations;

performing write operations on a fourth set of memory cells;

verifying the data states on the fourth set of memory cells to identify any memory cells of the fourth set of memory cells which did not properly store data during the write operations; and latching an address of the identified memory cells from the first, second, third and fourth set of memory cells which did not properly store data.

2. The method of writing data to memory cells of a flash memory of claim 1, further comprising:

accessing the memory cells located in the first, second, third and fourth set of memory cells which did not properly store data; and performing a single rewrite operation on the accessed memory cells.

3. The method of writing data to memory cells of a flash memory of claim 1, wherein the memory cells are floating gate memory cells.

4. A memory system comprising:
a power detector to detect a programming voltage provided by a power supply, wherein the power detector provides an output signal; and
a control circuit coupled to the power detector, the control circuit adjusts a number of memory cells which are accessed during a write operation in response to the output signal of the power detector.

5. The memory system of claim 4, wherein the power detector includes a set of comparator circuits which each have a predetermined threshold value.

6. The memory system of claim 4, wherein the control circuit accesses 4 bits of data in response to an output signal from the voltage detector indicating a programming voltage of 3 volts.

7. The memory system of claim 4, wherein the control circuit accesses 4 bits of data in response to an output signal from the voltage detector indicating a programming voltage of 5 volts.

8. The memory system of claim 4, wherein the control circuit accesses 4 bits of data in response to an output signal from the voltage detector indicating a programming voltage of 12 volts.

9. The memory system of claim 4, wherein the power supply is internal.

10. The memory system of claim 4, wherein the power supply is external.

11. A processing system, comprising:
a microprocessor coupled to a memory device;
the memory device comprising:
an array of memory cells;
a power detection circuitry coupled to internal and external power supplies for determining available write operation programming power;
a control circuitry for performing data write operations on the array of memory cells, the control circuitry is coupled to the power detection circuitry and is adapted to adjust a number of memory cells programmed in one write operation in response to the available write operation programming power; and
wherein data is written to the memory cells in a plurality of memory cell groups, and a rewrite operation is performed after data is written to all of the plurality of memory cells groups to program only memory cells which were not properly written to a correct date state.

12. The processing system of claim 11, wherein the control circuit limits the flash memory to programming four memory cells per write operation if a three volt programming voltage is detected.

13. The processing system of claim 11, wherein the control circuit limits the flash memory to programming eight memory cells per write operation if a five volt programming voltage is detected.

14. The processing system of claim 11, wherein the control circuit limits the flash memory to programming sixteen memory cells per write operation if a twelve volt programming voltage is detected.

15. The processing system of claim 11, wherein a charge pump is coupled to the power detection circuitry for detecting the available write operation programming power.

16. The processing system of claim 11, wherein the memory cells are floating gate memory cells.

17. A processing system comprising:
a flash controller coupled to a memory device;
the memory device comprising:
an array of memory cells,
a power detection circuitry coupled to internal and external power supplies for determining available write operation programming power,
control circuitry for performing data write operations on the array of memory cells, the control circuitry is coupled to the power detection circuitry and is adapted to adjust a number of memory cells programmed in one write operation in response to the available write operation programming power, and
wherein data is written to the memory cells in a plurality of memory cell groups, and a rewrite operation is performed after data is written to all of the plurality of memory cells groups to program only memory cells which were not properly written to a correct date state.

18. The processing system of claim 17, wherein the control circuit limits the flash memory to programming four memory cells per write operation if a three volt programming voltage is detected.

19. The processing system of claim 17, wherein the control circuit limits the flash memory to programming eight memory cells per write operation if a five volt programming voltage is detected.

20. The processing system of claim 17, wherein the control circuit limits the flash memory to programming sixteen memory cells per write operation if a twelve volt programming voltage is detected.

21. The processing system of claim 17, wherein a charge pump is coupled to the power detection circuitry for detecting the available write operation programming power.

22. The processing system of claim 17, wherein the memory cells are floating gate memory cells.

23. A method of operating a data system, the method comprising:
coupling a microprocessor to a memory device;
using a memory device to determine available write operation programming power including using a power detection circuitry coupled to internal and external power supplies;
adjusting a number of memory cells programmed in one write operation in response to the available write operation programming power using the control circuitry coupled to the power detection circuitry;
writing data to the memory cells in a plurality of memory cell groups; and
performing a rewrite operation after data is written to all of the plurality of memory cell groups to program only memory cells which were not properly written to a correct data state.

24. The method of claim 23, wherein the memory device comprises a control circuit which limits a flash memory to programming four memory cells per write operation if a three volt programming voltage is detected.

25. The method of claim 23, wherein the memory device comprises a control circuit which limits a flash memory to programming eight memory cells per write operation if a five volt programming voltage is detected.

26. The method of claim 23, wherein the memory device comprises a control circuit which limits a flash memory to programming sixteen memory cells per write operation if a twelve volt programming voltage is detected.

27. The method of claim 23, wherein the memory device comprises, a charge pump for providing a programming voltage, the charge pump is coupled to power detection circuitry for detecting the available write operation programming power.

28. The method of claim 23, wherein the memory cells are floating gate memory cells.

29. The method of claim 23, wherein a data state of the plurality of memory cell groups is verified after data is written to all of the plurality of memory cell groups.

30. A method of operating a data system, the method, comprising:

coupling a flash controller to a memory device;

using a memory device to determine available write operation programming power including using a power detection circuitry coupled to internal and external power supplies;

adjusting a number of memory cells programmed in one write operation in response to the available write operation programming power using a control circuitry coupled to the power detection circuitry;

writing data to the memory cells in a plurality of memory cell groups; and performing a rewrite operation after data is written to all of the plurality of memory cell groups to program only memory cells which were not properly written to a correct data state.

31. The method of claim 30, wherein the memory device comprises a control circuit which limits a flash memory to programming four memory cells per write operation if a three volt programming voltage is detected.

32. The method of claim 30, wherein the memory device comprises a control circuit which limits a flash memory to programming eight memory cells per write operation if a five volt programming voltage is detected.

33. The method of claim 30, wherein the memory device comprises a control circuit which limits a flash memory to programming sixteen memory cells per write operation if a twelve volt programming voltage is detected.

34. The method of claim 30, wherein the memory device comprises, a charge pump for providing a programming voltage, the charge pump is coupled to power detection circuitry for detecting the available write operation programming power.

35. The method of claim 30, wherein the memory cells are floating gate memory cells.

36. The method of claim 30, wherein a data state of the plurality of memory cell groups is verified after data is written to all of the plurality of memory cell groups.

* * * * *

UNITED STATES PATENT AND TRADEMARK OFFICE
CERTIFICATE OF CORRECTION

PATENT NO.: 6,014,332
DATED: Jan. 11, 2000
INVENTOR(S): Roohparvar

It is certified that error appears in the above-identified patent and that said Letters Patent is hereby corrected as shown below:

On the cover page, in line 12 of the abstract, delete "where not properly" and insert --were not properly--, therefor.

On the cover page, after "*Attorney, Agent, or Firm*", insert a comma after "Lundberg".

In column 7, line 49, delete "memory cells groups" and insert --memory cell groups--, therefor.

In column 7, line 50, delete "date" and insert --data--, therefor.

In column 8, line 17, delete "memory cells groups" and insert --memory cell groups--, therefor.

In column 8, line 18, delete "date" and insert --data--, therefor.

Signed and Sealed this

Fifteenth Day of May, 2001

*Attest:*

NICHOLAS P. GODICI

*Attesting Officer*     *Acting Director of the United States Patent and Trademark Office*